(12) United States Patent
Keating

(10) Patent No.: US 7,250,822 B2
(45) Date of Patent: *Jul. 31, 2007

(54) CLOCK OSCILLATOR

(75) Inventor: Pierce Keating, Issaquah, WA (US)

(73) Assignee: RadioFrame Networks, Inc., Redmond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/255,094

(22) Filed: Oct. 19, 2005

(65) Prior Publication Data

US 2006/0109058 A1    May 25, 2006

Related U.S. Application Data

(63) Continuation of application No. 10/749,798, filed on Dec. 30, 2003, now Pat. No. 6,975,174.

(60) Provisional application No. 60/437,667, filed on Dec. 31, 2002.

(51) Int. Cl.
*H03D 13/00* (2006.01)
(52) U.S. Cl. .................... 331/1 A; 331/38; 331/187
(58) Field of Classification Search .................. None
See application file for complete search history.

*Primary Examiner*—Kenneth B. Wells
*Assistant Examiner*—An T. Luu
(74) *Attorney, Agent, or Firm*—Van Pelt, Yi & James LLP

(57) ABSTRACT

An oscillator circuit and a method of generating an oscillating signal are disclosed. An oscillator comprises a first flip-flop and a second flip-flop coupled with the first flip-flop to provide an oscillating signal. A method of generating an oscillating signal comprises providing the oscillating signal as a first clock input to a first flip flop, inverting the oscillating signal and providing the inverted oscillating signal as a second clock input to a second flip flop, using the output of the first flip flop and the output of the second flip flop to generate a combined output that alternates between a logic low level and a logic high level, and using the combined output to sustain the oscillation of the oscillating signal.

19 Claims, 3 Drawing Sheets

Clock Oscillator Circuit

Clock Oscillator Circuit

| State | D1 | Startup | X1 | D2 | Clk out | C1 |
|---|---|---|---|---|---|---|
| 0 | 1 | 1 | 0 | 0 | 0 | 1 |
| 1 | 1 | 0 | 1 | 0 | 1 | 0 |
| 2 | 1 | 0 | 1 | 1 | 0 | 1 |
| 3 | 0 | 0 | 0 | 1 | 1 | 0 |
| 4 | 0 | 0 | 0 | 0 | 0 | 1 |
| 5 | 1 | 0 | 1 | 0 | 1 | 0 |

FIG. 3

CLOCK OSCILLATOR

CROSS REFERENCE TO RELATED APPLICATIONS

This applicant is a CON of Ser. No. 10/749,798 filed on Dec. 30, 2003, now U.S. Pat. No. 6,975,174 which claims priority to U.S. Provisional Patent Application No. 60/437,667 entitled CLOCK OSCILLATOR CIRCUIT filed Dec. 31, 2002 which is incorporated herein by reference for all purposes.

FIELD OF THE INVENTION

The present invention relates generally to circuit design. More specifically, a clock oscillator circuit is disclosed.

BACKGROUND OF THE INVENTION

In digital circuit design, it is sometimes useful to have a free-running clock oscillator that can provide a higher frequency clock than the system clock. FIG. 1 is a block diagram illustrating a conventional clock oscillator design. In this example, a ring oscillator 100 includes several gain stages with delay (102-108) and an inverter 110. The overall phase shift between input 112 and output 114 is 360 degrees. The circuit has an oscillation frequency that corresponds to the cumulative delay.

To guarantee clock compatibility with conventional logic circuits, the clock signal provided by the oscillator should have good precision. Since the frequency and waveform of the ring oscillator may vary due to variations in the manufacturing process or changes in the operating temperature of the circuit, ring oscillators are generally not used in digital integrated circuit (IC) design. Ring oscillators are typically avoided in the designs of semi-custom digital ICs such as gate-array application specific integrated circuits (ASICs) or field programmable gate arrays (FPGAs), because these circuits require the clock signals that meet certain minimum voltage levels as well as pulse widths for the flip-flops used in the circuits. It would be desirable to have a clock oscillator design that could meet the specifications of the circuits. It would also be useful if the clock signal could consistently meet its requirements despite variations in the process and operating conditions.

BRIEF DESCRIPTION OF THE DRAWINGS

Various embodiments of the invention are disclosed in the following detailed description and the accompanying drawings.

FIG. 3 is a table illustrating the operations of the oscillator circuit shown in FIG. 2.

DETAILED DESCRIPTION

The invention can be implemented in numerous ways, including as a process, an apparatus, a system, a composition of matter, a computer readable medium such as a computer readable storage medium or a computer network wherein program instructions are sent over optical or electronic communication links. In this specification, these implementations, or any other form that the invention may take, may be referred to as techniques. In general, the order of the steps of disclosed processes may be altered within the scope of the invention.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

A clock oscillator circuit is disclosed. In some embodiments, flip-flops are used to generate the oscillating signal. In some embodiments, flip-flops are configured to toggle alternately to generate the oscillating signal. The flip-flops may be combined with a feedback configuration. In some embodiments, a startup signal is used to start the oscillation. In some embodiments, the output signal is monitored continuously, and the oscillation is restarted in the event that the output signal is detected to have stopped oscillating.

Figure 1:
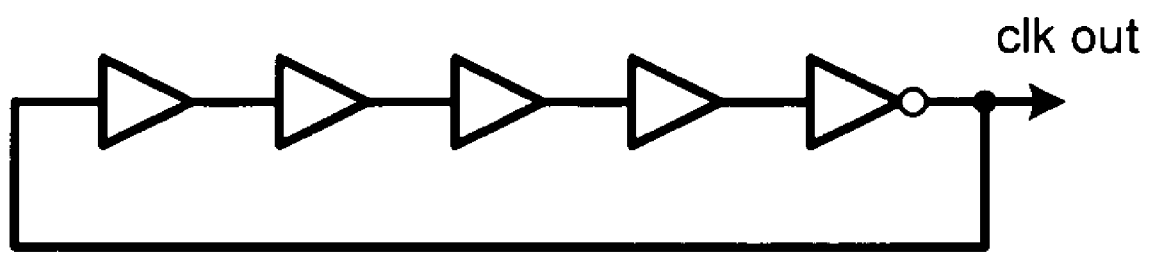
FIG. 1 is a block diagram illustrating a conventional clock oscillator design.
Figure 2:
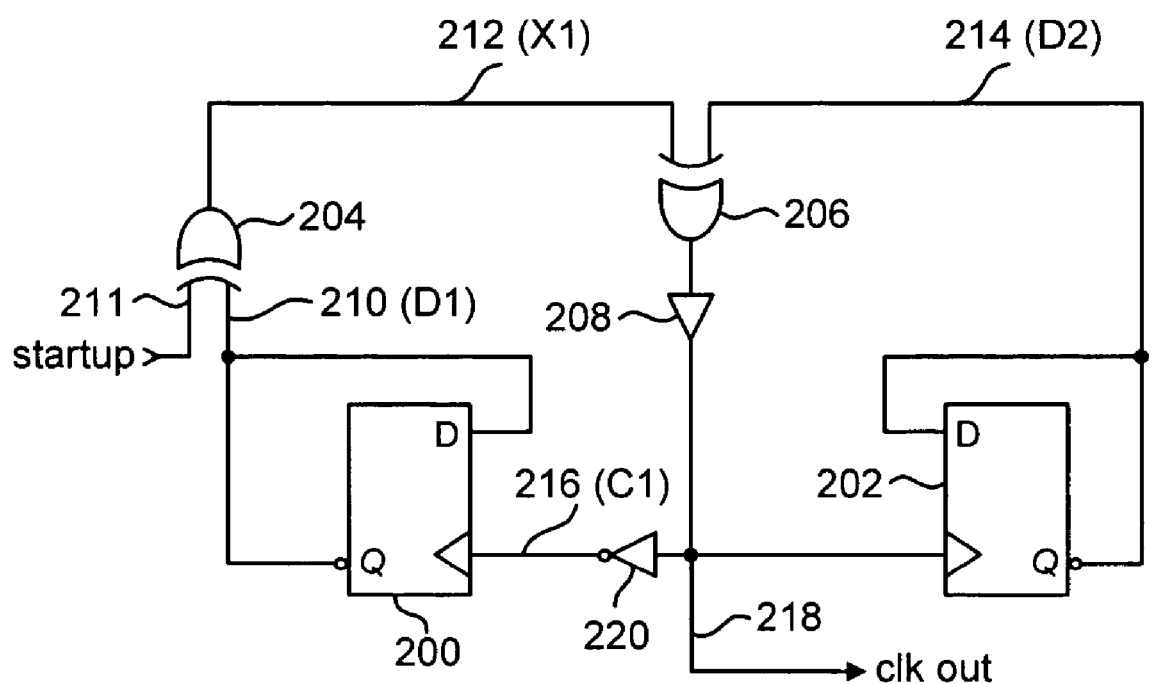
FIG. 2 is a block diagram illustrating a clock oscillator circuit used in some embodiments.

FIG. 2 is a block diagram illustrating a clock oscillator circuit used in some embodiments. In this example, flip-flops 200 and 202 are configured in a cross-coupled feedback arrangement to provide oscillation. The oscillation frequency of the circuit is near the maximum frequency at which the flip-flops can toggle (also referred to as the maximum toggling frequency). The capacitance of the circuit, such as the capacitance of optional clock buffer 208, affects the oscillation frequency in some embodiments, making the oscillation frequency slower than the maximum toggling frequency.

In some embodiments, the oscillator circuit employs substantially the same type of flip-flops as the circuit to which the oscillator output is applied. By using substantially the same type of flip-flops as the rest of the circuit, the oscillator can provide a clock signal that meets the specifications of the circuit, including the voltage levels, the pulse widths, etc. Stated another way, the circuit of FIG. 2 by inspection provides a clock signal sufficient to drive flip flops of the type used to generate the signal, because the generated clock signal is the clock signal used to toggle the clock circuit flip flops. The oscillator circuit preferably resides on the same die as the circuit to which the clock signal is applied, thus reducing the process variation between the oscillator circuit and the rest of the circuit.

In the example shown, the data input terminal of flip-flop 200, D, is connected to a negated output of the flip-flop's output terminal Q to form a toggle flip-flop. Flip-flop 202 is similarly configured. Both flip-flops used in this example are positive edge triggered flip-flops, although negative edge triggered flip-flops or a combination of negative and positive edge triggered flip-flops may be used in some embodiments. Once the flip-flop receives a positive edge on its clock input, the flip-flop toggles, setting its data output to the inverse of the data input value immediately before the positive clock edge is received. As shown, the flip flop also sets the value of data input D to its inverse. The output of flip-flop 200 is sent to an XOR gate 204. Also sent to XOR gate 204 is a startup signal used to start the oscillation of the circuit.

Details of the startup signal are discussed below. In some alternative embodiments, the startup signal and XOR gate 204 are omitted, and the clock circuit is started by another mechanism. The output of XOR gate 204 is sent to another XOR gate 206. Also sent to XOR gate 206 is the output of flip-flop 202. The output of XOR gate 206 is optionally buffered by a clock buffer 208. Buffered signal 218 is the oscillating clock signal that is the oscillator's output. Clock signal 218, also labeled "clkout" in the diagram, is fed back to the flip-flops. The clock signal is directly used as the clock input of flip-flop 202. An inverter 220 inverts the clock signal and sends it to the clock input of flip-flop 200. In some embodiments, instead of a separate inverter, the inversion function is incorporated into flip-flop 200. As shown, the positive transition of the oscillating signal is followed by a negative transition, which is then followed by a positive transition. The flip-flops shown in this example are configured in a cross-coupled feedback arrangement such that one of the flip-flops is triggered on the positive transition of the signal and another of the flip-flops is triggered on the negative transition of the signal. Oscillation is thus sustained.

Clock buffer 208 is used to reduce clock skew, thereby allowing all corresponding flip-flops to receive the clock signal at approximately the same time. More specifically, the clock buffer comprises a network of one or more buffers and routing designed to substantially equalize the delay to all endpoints of the buffer. Such a buffer is sometimes referred to as a "clock tree" in semi-custom and full custom digital ASIC design and as a "clock buffer" in FPGA design. As used herein, a clock buffer refers to a buffer or plurality of buffers used to couple a clock signal to one or more logic devices such as flip-flops. The clock buffer may be omitted in some embodiments, such as circuits with asynchronous design. In some embodiments, the clock signal generated by the circuit of FIG. 2 is used to drive via a clock buffer one or more flip flops comprising a primary circuit, and in such embodiments including the clock buffer 208 in the circuit of FIG. 2 guarantees that the clock signal provided as output by the circuit of FIG. 2 is sufficient to drive the flip flops of the primary circuit via a clock buffer.

FIG. 3 is a table illustrating the operations of the oscillator circuit shown in FIG. 2. The logic values of different parts of the circuit in several states are shown. D1 (signal 210 of FIG. 2) is the data input as well as the inverted data output of flip-flop 200. Startup (signal 211 of FIG. 2) is a startup signal used to initiate clock oscillation. X1 is the result of an XOR operation applied to startup and D1. D2 (signal 214 of FIG. 2) is the data input as well as the inverted data output of flip-flop 202. The clock signal generated by the oscillator circuit, clkout (signal 218 of FIG. 2), is the result of an XOR operation applied to X1 and D2. It is also the input clock used to toggle flip-flop 202. C1 (signal 216 of FIG. 2) is the inverse of clkout, used as the input clock for toggling flip-flop 200.

The oscillator circuit is stable at DC. State 0 shows the values of signals with clkout at 0. Assume initial conditions in which D1 is high (equal to 1) and D2 is low (equal to 0). Assume further that startup is high initially. As a result, X1 is equal to 0 and clkout remains stable at 0, because the value of D2, the other input to XOR 206, is 0. The circuit is in DC steady-state.

In the embodiment shown in FIG. 2, startup toggles from 1 to 0 to start oscillation, as shown in state 1 of the table. Since D1 is still 1, X1 is now 1. Input values of X1 of 1 and D2 of 0 to XOR 206 generates clkout of 1, and C1 of 0. The oscillator begins to oscillate. In some embodiments, the startup signal is omitted and oscillation can be started by another mechanism, e.g., as the result of differences in the response of the remaining components of the clock circuit when a circuit or component comprising the clock circuit is powered up.

The change of clkout from 0 to 1 in the previous state provides a positive clock edge that causes flip-flop 202 to toggle. Accordingly, in state 2, D2 changes from 0 to 1. The change of C1 from 1 to 0 in the previous state leads to a negative clock edge, thus flip-flop 200 does not toggle. As a result, D1 remains at 1. Startup will remain at 0 now that the circuit has been started, which will in this example result in the output of XOR 204 being the same as the value of D1. As a result, in state 1 X1 remains at 1. The result of an XOR operation on X1 and D2 leads to clkout of 0 and C1 of 1.

In the next state, state 3, the change of C1 from 0 to 1 provides a positive clock edge that causes flip-flop 200 to toggle. D2 changes from 1 to 0, and X1 becomes 0. D2 is unchanged since the change of clkout from 1 to 0 in the previous state does not provide a positive edge. The resulting clkout is 1 and C1 is 0.

In the next state, state 4, flip-flop 202 toggles once again and D2 changes from 1 to 0. D1 and X1 are unchanged and equal to 0. Thus, the corresponding clkout is 0 and C1 is 1.

In the next state, state 5, flip-flop 200 toggles and D1 changes from 0 to 1. X1 is now 1. Flip-flop 202 does not change and D2 remains at 0. Clkout is now 1 and C1 is 0. The values in state 5 are the same as the values in state 2 and the process for updating the states is repeated. The flip-flops continue to toggle alternately, thereby changing in the clock output and sustaining the oscillation of the circuit.

The output signal clkout may be sent to or implemented in an FPGA, an ASIC, or other appropriate devices or components. In some embodiments, clkout is monitored to ensure that the oscillation continues. In the event the oscillation is detected to have stopped, the startup signal can be reset to restart the oscillation process.

A technique for providing a clock signal has been disclosed. For the purposes of illustration, the above examples show circuits implemented using two flip-flops. Other configurations may also be used. For example, a different number of flip-flops may be used in some embodiments. Besides flip-flops, one or more elements that can sample their data inputs and change their outputs according to clock signals may also be used. Such elements include logic gates, latches, or combinations thereof.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. An oscillator comprising:
  a first flip-flop configured to receive, as a clock input of the first flip-flop, an output oscillating signal associated with the oscillator;
  a second flip-flop configured to receive, as a clock input of the second flip-flop, an inverted output oscillating signal; and
  a combining element configured to receive and combine an output of the first flip-flop and an output of the second flip-flop to provide the output oscillating signal.

2. An oscillator as recited in claim 1, wherein the oscillating signal has an oscillation frequency close to a maximum toggling frequency of the flip-flop.

3. An oscillator as recited in claim 1, wherein the first and the second flip-flops are configured in a feedback arrangement.

4. An oscillator as recited in claim 1, wherein the first and the second flip-flops are configured in a feedback arrangement wherein the oscillating signal is fed back to the clock input of the first flip-flop and the clock input of the second flip-flop.

5. An oscillator as recited in claim 1, wherein the first and the second flip-flops are configured in a cross-coupled feedback arrangement.

6. An oscillator as recited in claim 1, wherein:
the first and the second flip-flops are configured in a cross-coupled feedback arrangement wherein the oscillating signal is fed back to the clock input of the first flip-flop and the clock input of the second flip-flop;
the oscillating signal has a positive transition and a negative transitions; and
the clock inputs of the first and the second flip-flops are configured to trigger on opposite transitions of the oscillating signal.

7. An oscillator as recited in claim 1, wherein the first and the second flip-flops are configured in a cross-coupled feedback arrangement to toggle alternately.

8. An oscillator as recited in claim 1, wherein the oscillating signal is applied to a circuit that includes a circuit flip-flop, and the first and second flip-flops are substantially the same type as the circuit flip-flop.

9. An oscillator as recited in claim 1, wherein the oscillating signal is applied to a circuit, and the oscillator resides on the same die as the circuit.

10. An oscillator as recited in claim 1, further comprising an interface for receiving a startup signal configure to start oscillation.

11. An oscillator as recited in claim 1, further comprising a clock buffer configured to buffer the oscillating signal.

12. An oscillator as recited in claim 1, wherein the oscillating signal is provided to a primary circuit via a primary circuit buffer and further comprising an oscillating signal buffer configured to buffer the oscillating signal in the same manner that the primary circuit buffer buffers the oscillating signal as provided to the primary circuit.

13. An oscillator as recited in claim 1, wherein the oscillating signal is sent to a field programmable gate array (FPGA).

14. An oscillator as recited in claim 1, wherein the oscillating signal is sent to an application specific integrated circuit (ASIC).

15. An oscillator as recited in claim 1, wherein the oscillating signal is monitored.

16. An oscillator as recited in claim 1, wherein the oscillating signal is monitored and the oscillator is restarted if it is determined that the output has ceased to oscillate.

17. An oscillator as recited in claim 1, further comprising an inverter configured to invert the output oscillating signal and provide the inverted output oscillating signal.

18. An oscillator as recited in claim 17, wherein the inverter and the second flip-flop are integrated into a single circuit element.

19. An oscillator as recited in claim 1, wherein the combining element comprises an XOR gate.

* * * * *